United States Patent
Cheng

(10) Patent No.: US 8,593,197 B1
(45) Date of Patent: Nov. 26, 2013

(54) DELAY LINE CIRCUIT, DELAY LOCKED LOOP AND TESTER SYSTEM INCLUDING THE SAME

(75) Inventor: Wen-Chang Cheng, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/606,019

(22) Filed: Sep. 7, 2012

(51) Int. Cl.
*H03H 11/26* (2006.01)

(52) U.S. Cl.
USPC .............. 327/278; 331/57; 327/158; 327/149

(58) Field of Classification Search
USPC ......... 327/156, 158, 276–279, 284–286, 149; 331/57
See application file for complete search history.

(56) References Cited

U.S. PATENT DOCUMENTS

| | | | |
|---|---|---|---|
| 6,995,590 B1* | 2/2006 | Pedersen | 327/158 |
| 8,289,088 B2* | 10/2012 | Dixit et al. | 331/57 |
| 2006/0164139 A1* | 7/2006 | Chong et al. | 327/158 |

* cited by examiner

*Primary Examiner* — Lincoln Donovan
*Assistant Examiner* — Thomas Skibinski
(74) *Attorney, Agent, or Firm* — Jianq Chyun IP Office

(57) ABSTRACT

The invention provides a delay line circuit. The delay line circuit includes a delay line section and a feedback selection section. The delay line section receives an input clock signal and a feedback clock signal and delays one of the input clock signal and the feedback clock signal to generate an output clock signal, wherein the delay line section includes a plurality of delay units coupled in series. The feedback selection section is coupled to the delay line section and feedbacks the output clock signal to one of the delay units to serve as the feedback clock signal based on a selection signal. Wherein, one of the input clock signal and the feedback clock signal is delayed by a specific number of the delay units based on the selection signal to changes the frequency of the output clock signal.

14 Claims, 3 Drawing Sheets

DELAY LINE CIRCUIT, DELAY LOCKED LOOP AND TESTER SYSTEM INCLUDING THE SAME

BACKGROUND OF THE INVENTION

1. Field of Invention

The present invention generally relates to a delay line circuit, a delay locked loop and a tester system, and more particularly, to the frequency adjustable delay line circuit, the delay locked loop, and the tester system including the same.

2. Description of Prior Art

For the operation of a DDR SDRAM (double data rate synchronous DRAM), a plurality of reference clock signals with a same frequency but different phases are used. A delay locked loop (DLL) is used to lock the input reference clock signal and to generate a plurality of output clock signals with different phases from that of the input reference clock signal.

In many applications, the delay locked loop is used for maintaining the duty cycle of the clock signal outputted by the delay locked loop at a preset value (i.e. fifty percent duty cycle) based on its characteristic.

However, the conventional delay locked loop can't change the frequency of the output clock signal. If designers want to apply frequency multiplying function and duty cycle maintaining function in a single IC design simultaneously, the phase locked loop must be added in to provide the frequency multiplying function. In this way, the chip size may increase and the clock signals between the delay locked loop and the phase locked loop also may interfere with each other to lead the performance of the circuit being affected.

SUMMARY OF THE INVENTION

The present invention is directed to a delay line circuit which provides a function of adjusting the frequency of an output clock signal outputted from the delay line circuit.

The present invention is directed to a delay locked loop which can lock the frequency and the duty cycle of the output clock signal simultaneously.

The present invention is directed to a tester system which can verify the function of adjusting frequency of the delay line circuit.

The invention provides a delay line circuit. The delay line circuit includes a delay line section and a feedback selection section. The delay line section receives an input clock signal and a feedback clock signal and delays one of the input clock signal and the feedback clock signal to generate an output clock signal, wherein the delay line section includes a plurality of delay units coupled in series. The feedback selection section is coupled to the delay line section and feedbacks the output clock signal to one of the delay units to serve as the feedback clock signal based on a selection signal. Wherein, one of the input clock signal and the feedback clock signal is delayed by a specific number of the delay units based on the selection signal to changes the frequency of the output clock signal.

In an embodiment of the invention, the delay line section is further controlled by a control voltage and generates the output clock signal based on the control voltage, and the control voltage is adjustable to changes the frequency of the output clock signal.

In an embodiment of the invention, the feedback selection section includes at least one multiplexer unit. The at least one multiplexer unit includes a first input terminal, a second input terminal, and an output terminal, wherein the first input terminal of the at least one multiplexer unit is coupled to a first one of the delay units, the output terminal is coupled to a second one of the delay units, and the second input terminal receives the output clock signal to serve as the feedback clock signal based on the selection signal.

In an embodiment of the invention, the at least one multiplexer unit outputs the output clock signal to serve as the feedback clock signal based on a first state of the selection signal, and the feedback clock signal is delayed by the specific number of the delay units to change the frequency of the output clock signal.

In an embodiment of the invention, the at least one multiplexer unit outputs the input clock signal delayed and outputted by the first one of the delay units to the second one of the delay units based on a second state of the selection signal, and the input clock signal is delayed by all of the delay units to generate the frequency of the output clock signal.

In an embodiment of the invention, the selection signal includes a plurality of multiplexing control signals. The feedback selection section includes a plurality of multiplexer units. Each of the multiplexer units includes a first input terminal, a second input terminal, and an output terminal, and each of the multiplexer units controlled by the corresponding multiplexing control signals. Wherein, the first input terminal of a m-th multiplexer unit of the plurality of multiplexer units is coupled to a first one of the delay units, the output terminal of the m-th multiplexer unit is coupled to a second one of the delay units, and the second input terminal of the m-th multiplexer unit receives the output clock signal to serve as the feedback clock signal based on a m-th multiplexing control signal. The first input terminal of a m+1-th multiplexer unit is coupled to a third one of the delay units, the output terminal of the m+1-th multiplexer unit is coupled to a fourth one of the delay units, and the second input terminal of the m+1-th multiplexer unit receives the output clock signal to serve as the feedback clock signal based on a m+1-th multiplexing control signal.

In an embodiment of the invention, the m-th multiplexer unit outputs the output clock signal to serve as the feedback clock signal based on a first state of the m-th multiplexing control signal, the m+1-th multiplexer unit outputs the feedback clock signal delayed and outputted by the third delay unit to the fourth delay unit based on a second state of the m+1-th multiplexing control signal, and the feedback clock signal is delayed by a first number of the delay units to change the frequency of the output clock signal.

In an embodiment of the invention, the m+1-th multiplexer unit outputs the output clock signal to serve as the feedback clock signal based on a first state of the m+1-th multiplexing control signal, and the feedback clock signal is delayed by a second number of the delay units to change the frequency of the output clock signal.

The invention provides a delay locked loop circuit. The delay locked loop includes a delay line circuit, a voltage generation section and a phase detection section. The delay line circuit receives an input clock signal and a feedback clock signal and delays one of the input clock signal and the feedback clock signal to generate an output clock signal, wherein the delay line circuit includes a plurality of delay units coupled in series, one of the input clock signal and the feedback clock signal is delayed by a specific number of the delay units based on a selection signal to changes the frequency of the output clock signal.

The invention provides a tester system. The tester system includes a delay line circuit and a test section. The delay line circuit receives an input clock signal and a feedback clock signal and delays one of the input clock signal and the feedback clock signal to generate an output clock signal, wherein the delay line circuit includes a plurality of delay units coupled in series, one of the input clock signal and the feedback clock signal is delayed by a specific number of the delay units based on a selection signal to changes the frequency of the output clock signal. The test section is coupled to the delay line circuit. The test section compares the output clock signal and a reference clock signal, and adjusts the control voltage to change the frequency of the output clock signal based on a comparison result.

In an embodiment of the invention, the tester section includes a comparison unit and a voltage setting unit. The comparison unit compares the output clock signal and the reference clock signal to provide the comparison result. The voltage setting unit is coupled to the comparison unit and adjusts the control voltage to change the frequency of the output clock signal based on the comparison result.

In an embodiment of the invention, the comparison unit includes a frequency divider, a phase detector and a counter. The frequency divider is coupled to the delay line circuit. The frequency divider receives the output clock signal and divides the frequency of the output clock signal by N to generate a divided output clock signal, wherein N is a natural number. The phase detector is coupled to the frequency divider. The phase detector compares the divided output clock signal with a reference clock signal, and generates the comparison result based on a phase difference between the divided output clock signal and the reference clock signal. The counter is coupled to the phase detector. The counter receives the comparison result and the reference clock signal and counts the reference clock signal to output a counting value according to the comparison result, wherein the counter increases or decreases the counting value based on the comparison result.

In an embodiment of the invention, the voltage setting unit includes a control voltage generator. The control voltage generator sets the control voltage based on the comparison result, and outputs the control voltage to the delay line circuit to change the frequency of the output clock signal.

In an embodiment of the invention, when the phase of the divided output clock signal leads the reference clock signal, the counter increases the counting value based on the comparison result, such that the control voltage generator decreases the control voltage to lower the frequency of the output clock signal, and when the phase of the divided output clock signal lags the reference clock signal, the counter decreases the counting value based on the comparison result, such that the control voltage generator increases the control voltage to increase the frequency of the output clock signal.

Accordingly, in the embodiment of the present invention, the delay line circuit and the delay locked loop thereof provide an additional function of frequency adjusting by adding the feedback mechanism in the proposed delay line circuit. Therefore, designer can implement the function of PLL with no chip size penalty by the proposed delay locked loop.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
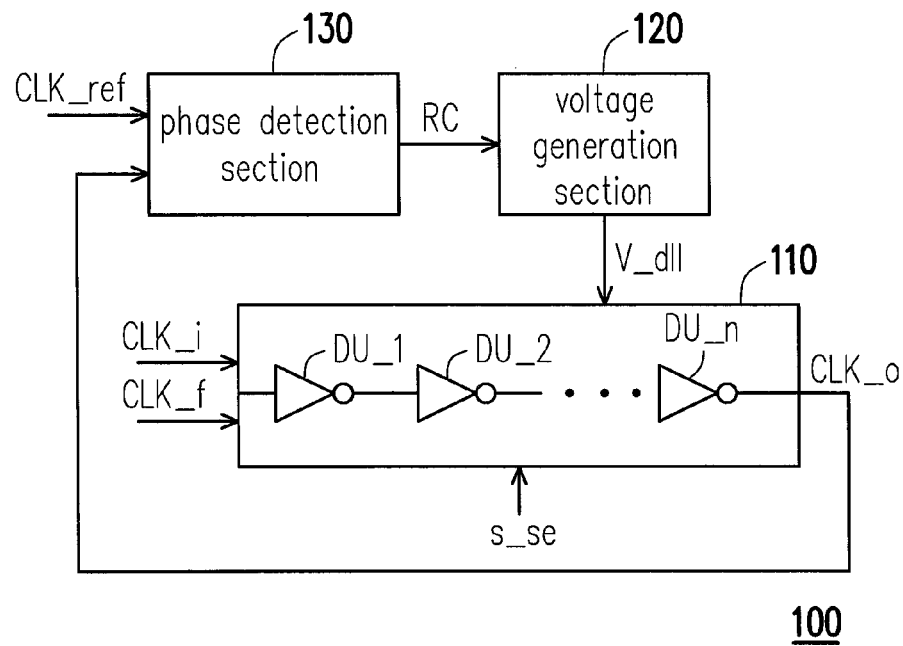
FIG. 1 illustrates a delay locked loop circuit according to an embodiment of the invention.

Reference will now be made in detail to the present preferred embodiment of the invention, examples of which are illustrated in the accompanying drawings. Wherever possible, the same reference numbers are used in the drawings and the description to refer to the same or like parts.

FIG. 1 illustrates a delay locked loop circuit according to an embodiment of the invention. Referring to FIG. 1, in present embodiment, a delay locked loop circuit 100 includes a delay line circuit 110, a voltage generation section 120 and a phase detection section 120. The delay line circuit 110 receives an input clock signal CLK_i and a feedback clock signal CLK_f and delays one of the input clock signal CLK_i and the feedback clock signal CLK_f to generate an output clock signal CLK_o. Wherein, the delay line circuit 110 comprises a plurality of delay units DU_1~DU_n coupled in series, and one of the input clock signal CLK_i and the feedback clock signal CLK_f is delayed by a specific number of the delay units based on a selection signal s_se to changes the frequency of the output clock signal CLK_o, wherein n is an integer.

The voltage generation section 120 is coupled to the delay line circuit 110 and provides a control voltage V_dll to the delay line circuit 110. Wherein, the delay line circuit generates the output clock signal CLK_o based on the control voltage V_dll, and the control voltage V_dll is adjustable to changes the frequency of the output clock signal CLK_o.

The phase detection section 130 is coupled to the voltage generation section 120 and the delay line circuit 110. The phase detection section 130 is used for comparing the phase difference between the output clock signal CLK_o and a reference clock signal CLK_ref to control the voltage generation section 120, such that the voltage generation section 120 generates the control voltage V_dll based on a comparison result RC of the phase detection section 130.

Specifically, the delay locked loop 100 can not only maintains the duty cycle of the output clock signal CLK_o, but also provides frequency multiplying function by the action of the delay line circuit 110.

Figure 2:
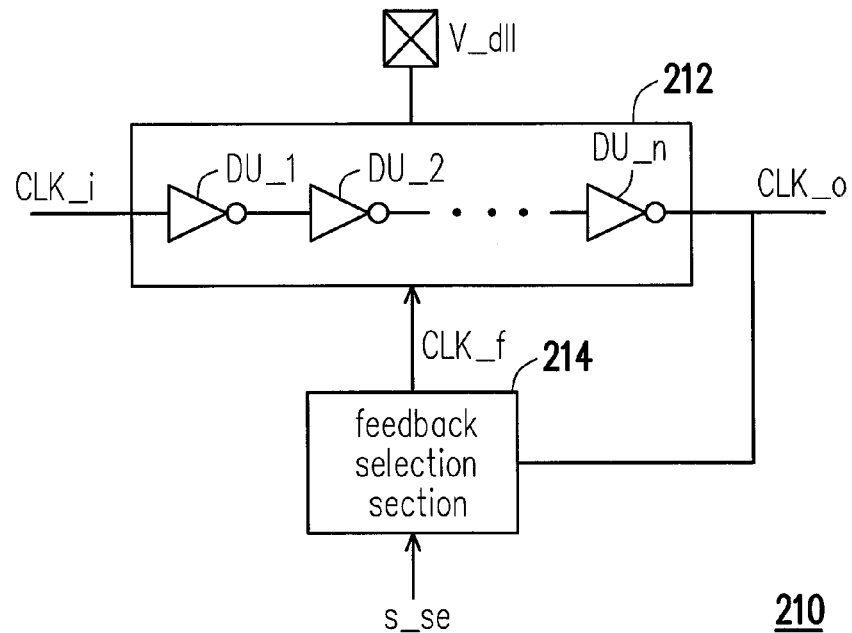
FIG. 2 illustrates a delay line circuit according to an embodiment of the invention.

In order to explain the embodiment of the present invention more clearly, the schematic diagram of the delay line circuit is shown in FIG. 2. FIG. 2 illustrates a delay line circuit according to an embodiment of the invention. Referring to FIG. 2, the delay line circuit 210 includes a delay line section 212 and a feedback selection section 214. The delay line section receives the input clock signal CLK_i and the feedback clock signal CLK_f and delays one of the input clock signal CLK_i and the feedback clock signal CLK_f to generate the output clock signal CLK_o. Wherein, the delay line section 212 includes a plurality of delay units DU_1~DU_n coupled in series.

The feedback selection section 214 is coupled to the delay line section 212. The feedback selection section 214 feedbacks the output clock signal CLK_o to one of the delay units DU_1~DU_n to serve as the feedback clock signal CLK_f based on the selection signal s_se. Wherein, one of the input clock signal CLK_i and the feedback clock signal CLK_f is delayed by a specific number of the delay units DU_1~DU_n based on the selection signal to changes the frequency of the output clock signal.

Furthermore, the delay line section 212 can be controlled by a control voltage V_dll to generates the output clock signal CLK_o based on the control voltage V_dll, and the control voltage V_dll is adjustable to changes the frequency of the output clock signal CLK_o. Wherein, the control voltage V_dll can be generated by the voltage generation section and the phase detection section as mention above or any other voltage control means, the present invention is not limited thereto.

In more details, when the feedback selection section 214 feedbacks the output clock signal CLK_o as the feedback clock signal CLK_f to one of the delay units DU_1~DU_n based on the selection signal s_se, the delay units next to the one perform oscillations like the behavior of a voltage control oscillator (VCO) according to the feedback clock signal CLK_f. Thus, the frequency of the output clock signal CLK_o can be multiplied to m times of the input clock signal according to the oscillation, wherein the value of m is response to the number of the delay units next to the one, and the value of m is non-zero real number. In other words, the delay line circuit 210 provides the function of adjusting frequency.

On the other hand, the control voltage V_dll is adjustable to tune the frequency of the output clock signal CLK_o in a smaller range than feedback the output clock signal CLK_o to perform oscillations. Accordingly, the frequency of the output clock signal CLK_o can be maintained to approximate to a preset value by detecting the phase difference between the output clock signal CLK_o and a reference clock signal. That is, the delay line circuit 210 lock the frequency of the output clock signal CLK_o as the function of a phase locked loop (PLL).

Figure 3:
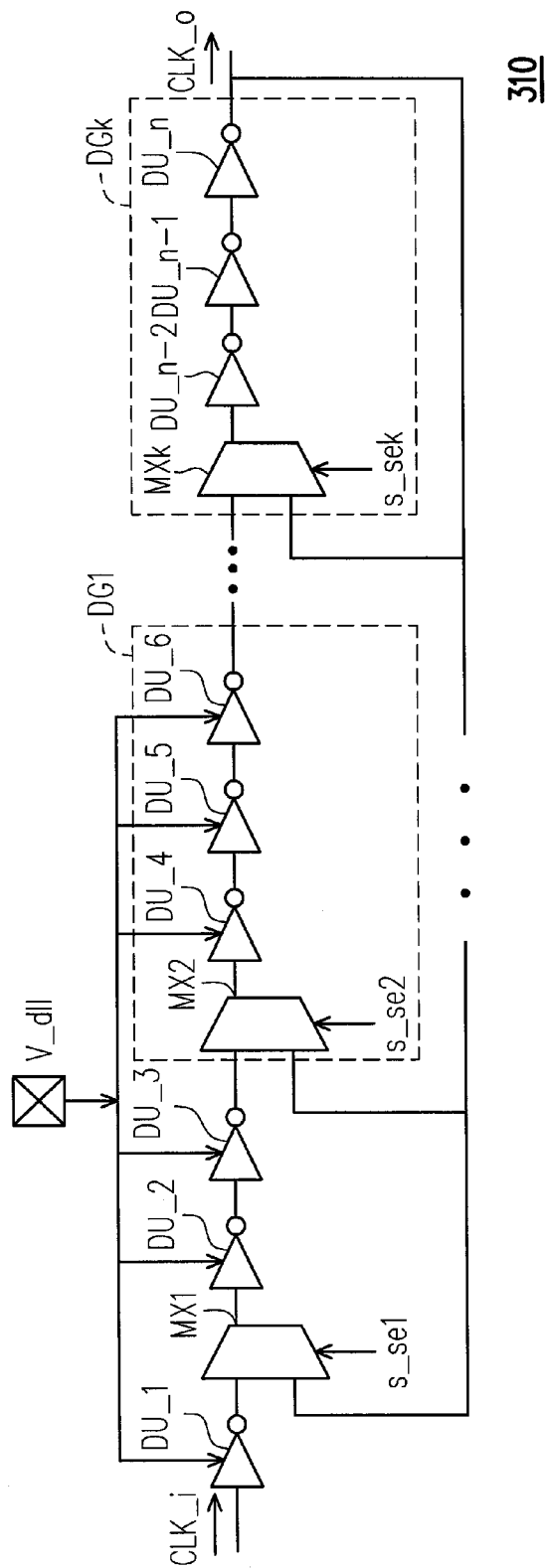
FIG. 3 illustrates a circuit diagram of a delay line circuit according to an embodiment of the invention.

In order to make the explanation clear, the circuit diagram of the delay line circuit is provided as shown in FIG. 3. FIG. 3 illustrates a circuit diagram of a delay line circuit according to an embodiment of the invention.

Referring to FIG. 3, the delay line circuit 310 includes a delay line section with delay units DU_1~DU_n coupled in series and a feedback selection section implement by a plurality of multiplexer units MX1~MXm, m is an integer. Wherein, the selection signal includes a plurality of multiplexing control signal s_se1~s_sem. Each of the delay units DU_1~DU_n is controlled by a control voltage V_dll, and the multiplexer units MX1~MXm are controlled by the multiplexing control signal s_se1~s_sem correspondingly. Herein, the multiplexer units MX2~MXm and the delay units DU_4~DU_n can be divided into a plurality of delay groups DG1~DGk, wherein k is an integer. Each of the delay groups DG1~DGk includes one multiplexer unit and three delay units, for example, the delay group DG1 includes multiplexer unit MX2 and delay units DU_4, DU_5 and DU_6, the delay group DGk includes multiplexer unit MXm and delay units DU_n-2, DUn-1 and DU_n. The number of delay units of each delay groups in FIG. 3 is a exemplary embodiment of the present invention, the present invention is not limited thereto.

In the present embodiment, each of the multiplexer units MX1~MXm includes a first input terminal, a second input terminal and an output terminal. The first input terminal of the multiplexer unit MX1 is coupled to the output terminal of the delay unit DU_1, the output terminal of the multiplexer unit MX1 is coupled to the input terminal of the delay unit DU_2, and the second input terminal of the multiplexer unit MX1 receives the output clock signal CLK_o to serve as the feedback clock signal.

The delay groups DG1~DGk couple to the output terminal of the delay unit DU_3 in series to output the output clock signal CLK_o. More specifically, the delay group DG1 includes the multiplexer unit MX2 and the delay units DU_4, DU_5 and DU_6. The first input terminal of the multiplexer unit MX2 is coupled to the output terminal of the delay unit DU_3, the output terminal of the multiplexer unit MX2 is coupled to the input terminal of the delay unit DU_4, and the second input terminal of the multiplexer unit MX2 receives the output clock signal CLK_o to serve as the feedback clock signal. The delay unit DU_5 and DU_6 delay the received signal in sequential and output it to the first input terminal of the multiplexer unit of the next delay group.

Similarly, the structure of the delay groups DG2~DGk can be inferred based on above mentioned, for example, the delay group DGk includes the multiplexer unit MXm and the delay unit DU_n-2, DU_n-1 and DU_n. In other words, the first input terminal of a m-th multiplexer unit MXm is coupled to the output terminal of a first one of the delay units (i.e. the delay unit of the previous delay group), the output terminal of the m-th multiplexer unit MXm is coupled to the input terminal of a second one of the delay units (i.e. the delay unit DU_n-2), and the second input terminal of the m-th multiplexer unit MXm receives the output clock signal CLK_o to serve as the feedback clock signal. The delay unit DU_n-1 and DU_n delay the received signal in sequential and output the output clock signal CLK_o.

Specifically, the delay line circuit 310 can output the output clock signal CLKo with different frequency in response to the selection signal. For example, when the multiplexing control signals s_se1~s_sem are disabled, the delay line circuit 310 may act like a conventional delay line and may generate the output clock signal CLK_o which has the same frequency with the input clock signal CLK_i. On the other hand, when one of the multiplexing control signals s_se1~s_sem, is enabled, the frequency of the output clock signal CLK_o may be changed based on the design requirements.

For example, when the multiplexing control signal s_se1 is in a first state (i.e. enable state) and the rest of multiplexing control signals s_se2~s_sem are in a second state (i.e. disable state), the multiplexer unit MX1 outputs the output clock signal CLK_o to serve as the feedback clock signal based on the first state of the multiplexing control signal s_se1, and the multiplexer unit MX2~MXm of each delay groups DG1~DGk output the feedback clock signal delayed and outputted by the corresponding delay unit in sequential based on the second state of the corresponding multiplexing control signal. Accordingly, the delay units DU_2~DU_n delay and output the output clock signal CLK_o in sequential to perform oscillations to adjust the frequency of the output clock signal CLK_o. In other words, at this condition, the feedback clock signal is delayed by n-1 delay units to change the frequency of the output clock signal CLK_o.

On the other hand, when the multiplexing control signal s_se2 is in the first state and the rest of multiplexing control signals are in the second state, the multiplexer unit MX2 outputs the output clock signal CLK_o to serve as the feedback clock signal based on the first state of the multiplexing control signal s_se2. Accordingly, the delay units DU_4~DU_n delay and output the output clock signal CLK_o in sequential and perform oscillations to adjust the frequency of the output clock signal CLK_o. At this condition, the feedback clock signal is delayed by n-3 delay units to change the frequency of the output clock signal CLK_o.

That is to say, the feedback selection section can be implemented by at least one multiplexer unit, which coupled between two adjacent delay units. Wherein, the first input terminal of the at least one multiplexer unit is coupled to a first one of the delay units, the output terminal is coupled to a second one of the delay units, and the second input terminal receives the output clock signal to serve as the feedback clock signal based on the selection signal. Accordingly, when the selection signal is in the first state, the at least one multiplexer unit outputs the output clock signal to serve as the feedback clock signal based on the first state of the selection signal, and the feedback clock signal is delayed by the specific number of the delay units to changes the frequency of the output clock signal, wherein the specific number of the delay units depends on the position of the at least one multiplexer unit. When the selection signal is in the second state, the at least one multiplexer unit outputs the input clock signal delayed and outputted by the first one of the delay units to the second one of the delay units based on the second state of the selection signal, and the input clock signal is delayed by all of the delay units to generate the frequency of the output clock signal.

Figure 4:
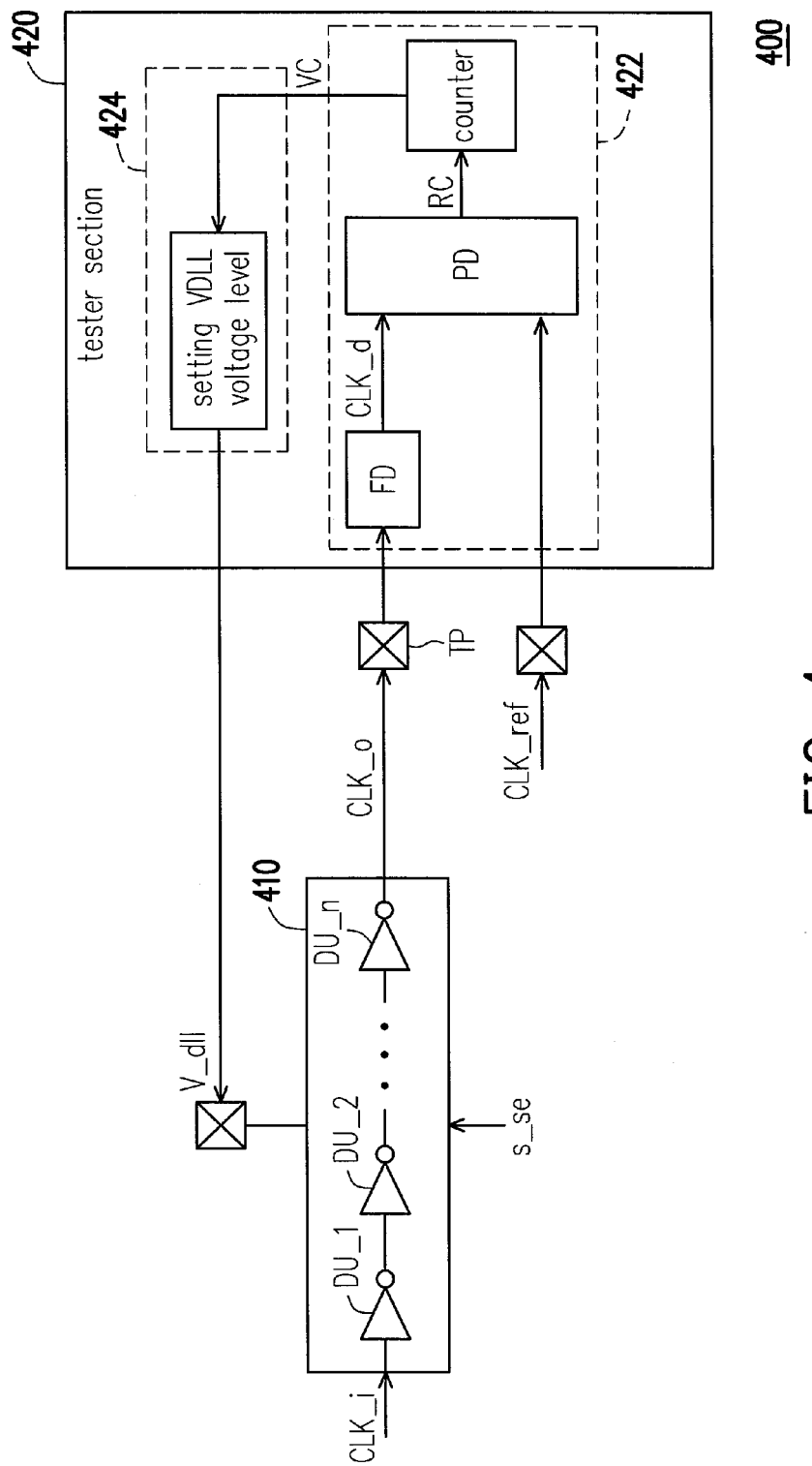
FIG. 4 illustrates a tester system according to an embodiment of the invention.

FIG. 4 illustrates a tester system according to an embodiment of the invention. Referring to FIG. 4, the tester system 400 includes a delay line circuit 410 and a tester section 420. Wherein, the function and the structure of the delay line circuit 410 is nearly the same as the delay line circuit 110 which mentioned above, so it will not repeat again.

The tester section 420 is coupled to the delay line circuit 410. The tester section 420 receives and compares the output clock signal CLK_o and a reference clock signal CLK_ref, and adjusts the control voltage V_dll to change the frequency of the output clock signal based on a comparison result.

The tester system 420 includes a comparison unit 422 and a voltage setting unit 424. The comparison unit 422 compares the output clock signal CLK_o and the reference clock signal CLK_ref to provide the comparison results. The voltage setting unit 424 is coupled to the comparison unit 422 and adjusts the control voltage V_dll to change the frequency of the output clock signal CLK_o based on the comparison result.

More specifically, the comparison unit 422 and the voltage setting unit 424 can be implemented by the functional blocks shown in FIG. 4. Wherein, in the present embodiment, the comparison unit 422 includes a frequency divider FD, a phase detector PD and a counter CT, and the voltage setting unit 424 includes a control voltage generator VG.

In the comparison unit 422, the frequency divider FD is coupled to the delay line circuit to receive the output clock signal CLK_o. The frequency divider divides the frequency of the output clock signal CLK_o by N to generate a divided output clock signal CLK_d, wherein N is a natural number. The phase detector PD is coupled to the frequency divider FD to compare the divided output clock signal CLK_d with a reference clock signal, and generates the comparison result RC based on a phase difference between the divided output clock signal CLK_f and the reference clock signal CLK_ref. The counter CT is coupled to the phase detector PD to receive the comparison result RC. The counter CT further receives and counts the reference clock signal CLK_ref to output a counting value vc according to the comparison result RC, wherein the counter CT increases or decreases the counting value based on the comparison result RC.

In the voltage setting unit 424, the control voltage generator VG is coupled to the comparison unit 420 and the delay line 410. The control voltage generator VG sets the control voltage V_dll based on the comparison result, and outputting the control voltage to the delay line circuit 410 to change the frequency of the output clock signal CLK_o.

In more details, the tester system 400 is used for testing the function of the delay line circuit 410. In this purpose, the delay line circuit 410 outputs the output clock signal CLK_o to a test pad TP of the tester section 420, so that the tester section 420 changes the control voltage V_dll to adjust the frequency of the delay line circuit 410 according to the phase difference between the output clock signal CLK_o and the reference clock signal CLK_ref. In this way, designer can verify the lock function of the delay line circuit 410.

For example, after the frequency divider FD divides the frequency of the output clock signal CLK_o and generates the divided output clock signal CLK_d which has the same frequency with the reference clock signal CLK_ref. The phase detector PD will detect the phase difference between the divided output clock signal CLKd and the reference clock signal CLK_ref. When the phase of the divided output clock signal CLK_ref leads the reference clock signal CLKref, the counter CT increases the counting value vc based on the comparison result RC, such that the control voltage generator VG decreases the control voltage V_dll to lower the frequency of the output clock signal CLK_o.

On the other hand, when the phase of the divided output clock signal CLK_d lags the reference clock signal CLK_ref, the counter CT decreases the counting value vc based on the comparison result RC, such that the control voltage generator VG increases the control voltage V_dll to increase the frequency of the output clock signal CLKo.

That is to say, the function of the tester section 420 is nearly like the function of the voltage generation section 120 and the phase detection section 130 in the delay locked loop shown in FIG. 1.

In summary, in the embodiment of the present invention, the delay line circuit and the delay locked loop thereof provide an additional function of frequency adjusting by adding the feedback mechanism in the proposed delay line circuit. Therefore, designer can implement the function of PLL with no chip size penalty by the proposed delay locked loop. Besides, the tester system of the embodiment of the present invention further provides a verification platform to the proposed delay line circuit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A delay line circuit, comprising:
a delay line section, receiving an input clock signal and a feedback clock signal and delaying one of the input clock signal and the feedback clock signal to generate an output clock signal, wherein the delay line section comprises a plurality of delay units coupled in series; and
a feedback selection section, coupled to the delay line section and feedbacking the output clock signal to one of the delay units to serve as the feedback clock signal based on a selection signal,
wherein one of the input clock signal and the feedback clock signal is delayed by a specific number of the delay units based on the selection signal to change the frequency of the output clock signal,
wherein the selection signal comprises a plurality of multiplexing control signals, and the feedback selection section comprises:
a plurality of multiplexer units, each of the multiplexer units comprising a first input terminal, a second input terminal, and an output terminal, and each of the multiplexer units controlled by the corresponding multiplexing control signals, wherein the first input terminal of a m-th multiplexer unit of the plurality of multiplexer units is coupled to a first one of the delay units, the output terminal of the m-th multiplexer unit is coupled to a second one of the delay units, and the second input terminal of the m-th multiplexer unit directly receives the output clock signal to serve as the feedback clock signal based on a m-th multiplexing control signal; and the first input terminal of a m+1-th multiplexer unit is coupled to a third one of the delay units, the output terminal of the m+1-th multiplexer unit is coupled to a fourth one of the delay units, and the second input terminal of the m+1-th multiplexer unit directly receives the output clock signal to serve as the feedback clock signal based on a m+1-th multiplexing control signal.

2. The delay line circuit according to claim 1, wherein the delay line section is further controlled by a control voltage and generates the output clock signal based on the control voltage, and the control voltage is adjustable to change the frequency of the output clock signal.

3. The delay line circuit according to claim 1, wherein the m-th multiplexer unit outputs the output clock signal to serve as the feedback clock signal based on a first state of the m-th multiplexing control signal, the m+1-th multiplexer unit outputs the feedback clock signal delayed and outputted by the third delay unit to the fourth delay unit based on a second state of the m+1-th multiplexing control signal, and the feedback clock signal is delayed by a first number of the delay units to change the frequency of the output clock signal.

4. The delay line circuit according to claim 1, wherein the m+1-th multiplexer unit outputs the output clock signal to serve as the feedback clock signal based on a first state of the m+1-th multiplexing control signal, and the feedback clock signal is delayed by a second number of the delay units to change the frequency of the output clock signal.

5. A delay locked loop circuit, comprising:

a delay line circuit, receiving an input clock signal and a feedback clock signal and delaying one of the input clock signal and the feedback clock signal to generate an output clock signal, wherein the delay line circuit comprises a plurality of delay units coupled in series, one of the input clock signal and the feedback clock signal is delayed by a specific number of the delay units based on a selection signal to change the frequency of the output clock signal;

a voltage generation section, coupled to the delay line circuit and providing a control voltage to the delay line circuit, wherein the delay line circuit generates the output clock signal based on the control voltage, and the control voltage is adjustable to changes the frequency of the output clock signal; and a phase detection section, coupled to the voltage generation section and the delay line circuit, for comparing the phase difference between the output clock signal and a reference clock signal, wherein the voltage generation section generates the control voltage based on a comparison result of the phase detection section, wherein the delay line circuit comprises:

a delay line section, receiving the input clock signal and the feedback clock signal and delaying one of the input clock signal and the feedback clock signal to generate the output clock signal, wherein the delay line section comprises the delay units coupled in series; and a feedback selection section, coupled to the delay line section and feedbacking the output clock signal to one of the delay units to serve as the feedback clock signal based on the selection signal, wherein one of the input clock signal and the feedback clock signal is delayed by the specific number of the delay units based on the selection signal to change the frequency of the output clock signal, wherein the selection signal comprises a plurality of multiplexing control signals, and the feedback selection section comprises:

a plurality of multiplexer units, each of the multiplexer units comprising a first input terminal, a second input terminal, and an output terminal, and each of the multiplexer units controlled by the corresponding multiplexing control signals, wherein the first input terminal of a m-th multiplexer unit of the plurality of multiplexer units is coupled to a first one of the delay units, the output terminal of the m-th multiplexer unit is coupled to a second one of the delay units, and the second input terminal of the m-th multiplexer unit directly receives the output clock signal to serve as the feedback clock signal based on a m-th multiplexing control signal; and the first input terminal of a m+1-th multiplexer unit is coupled to a third one of the delay units, the output terminal of the m+1-th multiplexer unit is coupled to a fourth one of the delay units, and the second input terminal of the m+1-th multiplexer unit directly receives the output clock signal to serve as the feedback clock signal based on a m+1-th multiplexing control signal.

6. The delay line circuit according to claim 5, wherein each of the multiplexer units controlled by the corresponding multiplexing control signals, the m-th multiplexer unit outputs the output clock signal to serve as the feedback clock signal based on a first state of the m-th multiplexing control signal, the m+1-th multiplexer unit outputs the feedback clock signal delayed and outputted by the third delay unit to the fourth delay unit based on a second state of the m+1-th multiplexing control signal, and the feedback clock signal is delayed by a first number of the delay units to change the frequency of the output clock signal.

7. The delay line circuit according to claim 5, wherein the m+1-th multiplexer unit outputs the output clock signal to serve as the feedback clock signal based on a first state of the m+1-th multiplexing control signal, and the feedback clock signal is delayed by a second number of the delay units to change the frequency of the output clock signal.

8. A tester system, comprising:

a delay line circuit, receiving an input clock signal and a feedback clock signal and delaying one of the input clock signal and the feedback clock signal to generate an output clock signal, wherein the delay line circuit comprises a plurality of delay units coupled in series, one of the input clock signal and the feedback clock signal is delayed by a specific number of the delay units based on a selection signal to change the frequency of the output clock signal; and a tester section, coupled to the delay line circuit, comparing the output clock signal and a reference clock signal, and adjusting the control voltage to change the frequency of the output clock signal based on a comparison result, wherein the delay line circuit comprises:

a delay line section, receiving the input clock signal and the feedback clock signal and delaying one of the input clock signal and the feedback clock signal to generate the output clock signal, wherein the delay line section comprises the delay units coupled in series; and a feedback selection section, coupled to the delay line section and feedbacking the output clock signal to one of the delay units to serve as the feedback clock signal based on the selection signal, wherein one of the input clock signal and the feedback clock signal is delayed by the specific number of the delay units based on the selection signal to change the frequency of the output clock signal, wherein the selection signal comprises a plurality of multiplexing control signals, and the feedback selection section comprises:

a plurality of multiplexer units, each of the multiplexer units comprising a first input terminal, a second input terminal, and an output terminal, and each of the multiplexer units controlled by the corresponding multiplexing control signals, wherein the first input terminal of a m-th multiplexer unit of the plurality of multiplexer units is coupled to a first one of the delay units, the output terminal of the m-th multiplexer unit is coupled to a second one of the delay units, and the second input terminal of the m-th multiplexer unit directly receives the output clock signal to serve as the feedback clock signal based on a m-th multiplexing control signal; and the first input terminal of a m+1-th multiplexer unit is coupled to a third one of the delay units, the output terminal of the a m+1-th multiplexer unit is coupled to a fourth one of the delay units, and the second input terminal of the a m+1-th multiplexer unit directly receives the output clock signal to serve as the feedback clock signal based on a m+1-th multiplexing control signal.

9. The tester system according to claim 8, wherein the tester section comprises:

a comparison unit, coupled to the delay line circuit and comparing the output clock signal and the reference clock signal to provide the comparison result; and a voltage setting unit, coupled to the comparison unit and the delay line circuit and adjusting the control voltage to change the frequency of the output clock signal based on the comparison result.

10. The tester system according to claim 9, wherein the comparison unit comprises:

a frequency divider, coupled to the delay line circuit, receiving the output clock signal, and dividing the frequency of the output clock signal by N to generate a divided output clock signal, wherein N is a natural number;

a phase detector, coupled to the frequency divider, comparing the divided output clock signal with the reference clock signal, and generating the comparison result based on a phase difference between the divided output clock signal and the reference clock signal; and a counter, coupled to the phase detector, receiving the comparison result and the reference clock signal and counting the reference clock signal to output a counting value according to the comparison result, wherein the counter increases or decreases the counting value based on the comparison result.

11. The tester system according to claim 10, wherein the voltage setting unit comprises:

a control voltage generator, coupled to the comparison unit and the delay line circuit, setting the control voltage based on the comparison result, and outputting the control voltage to the delay line circuit to change the frequency of the output clock signal.

12. The tester system according to claim 11, wherein when the phase of the divided output clock signal leads the reference clock signal, the counter increases the counting value based on the comparison result, such that the control voltage generator decreases the control voltage to lower the frequency of the output clock signal, and when the phase of the divided output clock signal lags the reference clock signal, the counter decreases the counting value based on the comparison result, such that the control voltage generator increases the control voltage to increase the frequency of the output clock signal.

13. The delay line circuit according to claim 8, wherein the m-th multiplexer unit outputs the output clock signal to serve as the feedback clock signal based on a first state of the m-th multiplexing control signal, the m+1-th multiplexer unit outputs the feedback clock signal delayed and outputted by the third delay unit to the fourth delay unit based on a second state of the m+1-th multiplexing control signal, and the feedback clock signal is delayed by a first number of the delay units to change the frequency of the output clock signal.

14. The delay line circuit according to claim 8, wherein the m+1-th multiplexer unit outputs the output clock signal to serve as the feedback clock signal based on a first state of the m+1-th multiplexing control signal, and the feedback clock signal is delayed by a second number of the delay units to change the frequency of the output clock signal.

* * * * *